(12) United States Patent
Wilson

(10) Patent No.: US 6,594,330 B1
(45) Date of Patent: Jul. 15, 2003

(54) PHASE-LOCKED LOOP WITH DIGITALLY CONTROLLED, FREQUENCY-MULTIPLYING OSCILLATOR

(75) Inventor: William B. Wilson, Macungie, PA (US)

(73) Assignee: Agere Systems Inc., Allentown, PA (US)

(*) Notice: Subject to any disclaimer, the term of this patent is extended or adjusted under 35 U.S.C. 154(b) by 0 days.

(21) Appl. No.: 09/427,312

(22) Filed: Oct. 26, 1999

(51) Int. Cl.⁷ ............................................. H03D 3/24
(52) U.S. Cl. ..................... 375/376; 327/148; 327/151; 327/157; 327/160
(58) Field of Search ..................... 375/316, 327, 375/373, 374, 375, 376, 141, 147, 148, 151, 155, 156, 157, 160

(56) References Cited

U.S. PATENT DOCUMENTS

| | | | |
|---|---|---|---|
| 4,563,657 A | 1/1986 | Qureshi et al. | 331/25 |
| 5,018,170 A | 5/1991 | Wilson | 375/120 |
| 5,187,722 A | 2/1993 | Petty | 375/118 |
| 5,260,608 A | 11/1993 | Marbot | 307/262 |
| 5,675,620 A * | 10/1997 | Chen | 375/376 |
| 5,790,614 A | 8/1998 | Powell | 375/376 |
| 6,163,186 A * | 12/2000 | Kurita | 327/157 |
| 6,356,129 B1 * | 3/2002 | O'Brien et al. | 327/175 |

OTHER PUBLICATIONS

"Charge–Pump Phase–Lock Loops," by Floyd M. Gardner, IEEE Trans. Commun. vol. COM–28, No. 11, Nov. 1980, pp. 321–329.

"Microwave and Wireless Synthesizers, Theory and Design," by Ulrich L. Rohde, 1997, 5 pages.

\* cited by examiner

*Primary Examiner*—Chi Pham
*Assistant Examiner*—Pankaj Kumar
(74) *Attorney, Agent, or Firm*—Steve Mendelsohn

(57) ABSTRACT

A phase-locked loop (PLL) having a digitally controlled oscillator (DCO), where the DCO receives a digital control signal generated by the PLL and an externally generated oscillator clock signal and generates an output signal having a frequency greater than that of the oscillator clock signal. In one embodiment, the DCO is an analog PLL, such as a fractional-N frequency synthesizer, that receives a two-part digital control signal corresponding to the integer and fractional portions of a desired multiplier. The feedback path within the DCO has a dual-modulus divider that is controlled by a modulus controller to apply, over time, an effective divisor value that achieves the desired degree of multiplication. PLLs of the present invention are especially applicable to low-bandwidth, low-noise applications, such as high-multiplication frequency synthesizers and clock filtering, that are integrated into digital ASICs.

4 Claims, 3 Drawing Sheets

PHASE-LOCKED LOOP WITH DIGITALLY CONTROLLED, FREQUENCY-MULTIPLYING OSCILLATOR

BACKGROUND OF THE INVENTION

1. Field of the Invention

The present invention relates to electronics, and, in particular, to phase-locked loops.

2. Description of the Related Art

A phase-locked loop (PLL) is a circuit that generates a periodic output signal that has a constant phase relationship with respect to a periodic input signal. PLLs are widely used in many types of measurement, microprocessor, and communication applications. One type of phase-locked loop is the charge-pump: PLL, which is described in Floyd M. Gardner, "Charge-Pump Phase-Lock Loops" *IEEE Trans. Commun.*, vol. COM-28, pp. 1849–1858, November 1980, the teachings of which are incorporated herein by reference.

FIG. 1 shows a block diagram of a conventional charge-pump phase-locked loop 100. Phase detector (PD) 102 compares the phase $\theta_{IN}$ of the input signal $F_{IN}$ to the phase $\theta_{OUT}$ of the feedback signal $F_{OUT}$ and generates an error signal: either an UP signal U(when $\theta_{IN}$ leads $\theta_{OUT}$) or a DOWN signal D (when $\theta_{OUT}$ leads $\theta_{IN}$), where the width of the error signal pulse indicates the magnitude of the difference between $\theta_{IN}$ and $\theta_{OUT}$.

Charge pump 104 generates an amount of charge equivalent to the error signal (either U or D) from PD 102. Depending on whether the error signal was an UP signal or a DOWN signal, the charge is either added to or subtracted from the capacitors in loop filter 106. For purposes of this explanation, loop filter 106 has a relatively simple design, consisting of a capacitor $C_S$ in parallel with the series combination of a resistor R and a relatively large capacitor $C_L$. As such, loop filter 106 operates as an integrator that accumulates the net charge from charge pump 104. Other, more-sophisticated loop filters are of course also possible. The resulting loop-filter voltage $V_{LF}$ is applied to voltage-controlled oscillator (VCO) 108. A voltage-controlled oscillator is a device that generates a periodic output signal ($F_{OUT}$ in FIG. 1), whose frequency is a function of the VCO input voltage ($V_{LF}$ in FIG. 1). In addition to being the output signal from PLL 100, the VCO output signal $F_{OUT}$ is used as the feedback signal for the closed-loop PLL circuit.

Optional input and feedback dividers 110 and 112 may be are placed in the input and feedback paths, respectively, if the frequency of the output signal $F_{OUT}$ is to be either a fraction or a multiple of the frequency of the input signal $F_{IN}$. If not, the input and feedback dividers can both be considered to apply factors of 1 to the input and feedback signals, respectively.

Charge-pump PLL 100 of FIG. 1 is an example of an analog PLL, in which VCO 108 is controlled by an analog input signal $V_{LF}$ generated by charge pump 104 and loop filter 106. Digital phase-locked loops are also known.

FIG. 2 shows a block diagram of a conventional digital phase-locked loop 200. PLL 200 is similar to $P_{LF}$ 100 of FIG. 1, except that charge pump 104 and loop filter 106 are replaced by a digital accumulator and filter 204 and voltage-controlled oscillator 108 is replaced by a digitally controlled oscillator (DCO) 208, which receives an externally generated, high-speed clock signal having frequency $F_{HSCK}$.

In operation, input divider 210, phase detector 202, and feedback divider 212 of PLL 200 operate analogously to input divider 110, phase detector 102, and feedback divider 112 of PLL 100, respectively. Instead of generating an analog voltage control signal, digital accumulator and filter 204 accumulates and filters the UP and DOWN signals generated by PD 202 to generate a digital control signal M, which has a positive integer value. DCO 208 uses the digital control signal M to convert the high-speed clock signal $F_{HSCK}$ into the PLL output signal $F_{OUT}$ according to Equation (1) as follows:

$$F_{OUT} = F_{HSCK}/M. \tag{1}$$

Since Equation (1) represents a division operation, in a conventional digital PLL, DCO 208 is implemented as a simple digital divider.

One application for PLLs is in frequency synthesizers with high multiplication ratios. For example, it may be desirable to implement a PLL having a multiplication ratio as high as 77,750 in order to convert an input signal $F_{IN}$ having a frequency of 8 kHz into a phase-locked output signal $F_{OUT}$ having a frequency of 622 MHz. In order for the feedback loop of a charge-pump PLL to remain stable, the frequency of the inputs to the phase detector must exceed the PLL closed-loop bandwidth. A typical ratio is 10. This means that, in order to use a charge-pump PLL for the previous example of a high-multiplication frequency synthesizer, the PLL closed-loop bandwidth should be on the order of 0.8 Hz.

Another application for PLLs is in clock filtering. Some clock filtering applications, such as SONET clock filtering, require PLL closed-loop bandwidths as low as 0.1 Hz.

One problem with using charge-pump PLLs in applications such as high-multiplication frequency synthesizers and clock filtering that have low closed-loop bandwidths, relates to noise. Charge-pump PLLs do not provide a large amount of cancellation of intrinsic noise generated within the feedback loop. As a result, for low-noise applications, PLL closed-loop bandwidth is usually maximized.

In light of these competing goals, charge-pump PLLs are often not suitable for applications requiring both a high degree of stability and a low amount of noise.

In general, it would be desirable to implement PLLs for applications such as high-multiplication frequency synthesizers and clock filtering, as part of digital ASICs (application-specific integrated circuits). One known way to integrate analog PLLs into digital ASICs is to base the VCO on a ring oscillator. A ring oscillator is a set of delay cells connected head to tail, whose output frequency is controlled by a voltage control signal applied to all of the delay cells. As mentioned before, in order to have low noise, a charge-pump PLL must have a relatively high loop bandwidth in order to allow the PLL feedback loop to cancel (or at least significantly reduce) internally generated noise. This in turn requires that the frequency at the phase detector (i.e., the PD update rate) also be large in order for the PLL to remain stable. However, since PLL applications, such as high-multiplication frequency synthesizers and clock filtering, require relatively low PLL loop bandwidths and the large multiplication value implies a relatively low input frequency for a fixed output frequency, it is impractical to integrate conventional ring-oscillator-based analog PLLs, such as charge-pump PLL 100 of FIG. 1, into digital ASICs for such applications.

It is also impractical to use conventional digital PLLs, such as PLL 200 of FIG. 2, in applications such as high-multiplication frequency synthesizers. Because the digitally controlled oscillator 208 simply divides down the input clock signal $F_{HSCK}$, in order to accurately generate a PLL output signal $F_{OUT}$ having a frequency as high as 622 MHz, $F_{HSCK}$ must have a frequency much higher than 622 MHz. This may be impractical in many applications. This is even more true for applications that require PLL output signals having frequencies greater than 622 MHz (e.g., as high as 1 GHz or even higher).

SUMMARY OF THE INVENTION

The present invention is directed to a PLL design that addresses limitations in the prior art. In particular, PLLs of the present invention can be used in applications such as high-multiplication frequency synthesizers and low-bandwidth clock filtering that are integrated into digital ASICs without having to sacrifice low-noise performance.

In one embodiment, the present invention is an integrated circuit (IC) having a phase-locked loop (PLL), the PLL comprising (a) a phase detector (PD), configured to receive a PLL input signal and a PLL feedback signal and to generate PLL PD signals based on differences in phase between the PLL input and PLL feedback signals; (b) an accumulator/filter, configured to receive the PLL PD signals from the phase detector and to generate a digital control signal; and (c) a digitally controlled oscillator (DCO), configured to:

(1) receive (i) the digital control signal from the accumulator/filter and (ii) an oscillator clock signal; and (2) to generate an output signal whose frequency is (i) based on the digital control signal and (ii) greater than the frequency of the oscillator clock signal, wherein the PLL feedback signal is generated from the output signal.

BRIEF DESCRIPTION OF THE DRAWINGS

Other aspects, features, and advantages of the present invention will become more fully apparent from the following detailed description, the appended claims, and the accompanying drawings in which:

DETAILED DESCRIPTION

Figure 2:
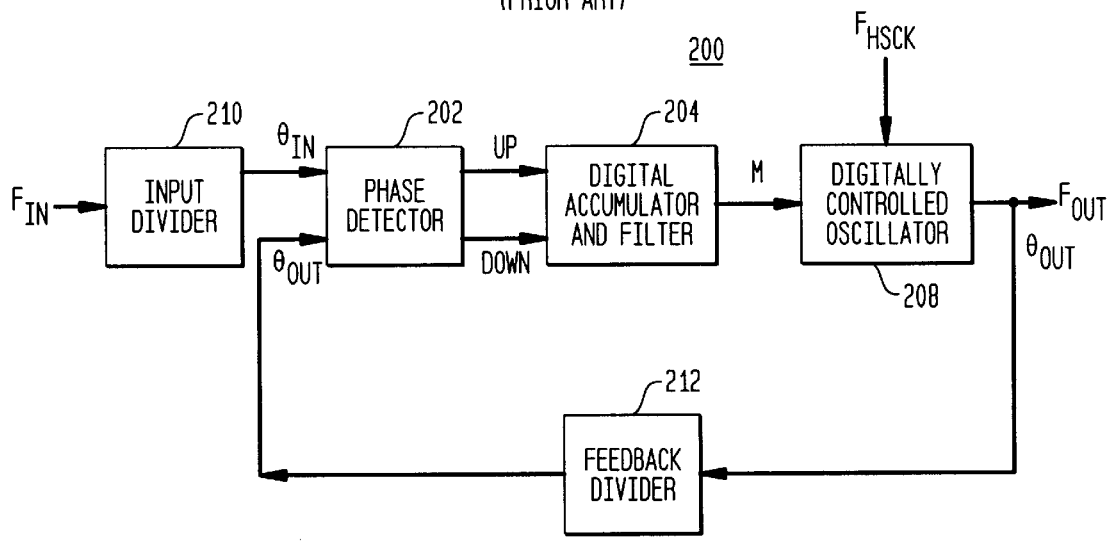
FIG. 2 shows a block diagram of a conventional digital PLL.
Figure 3:
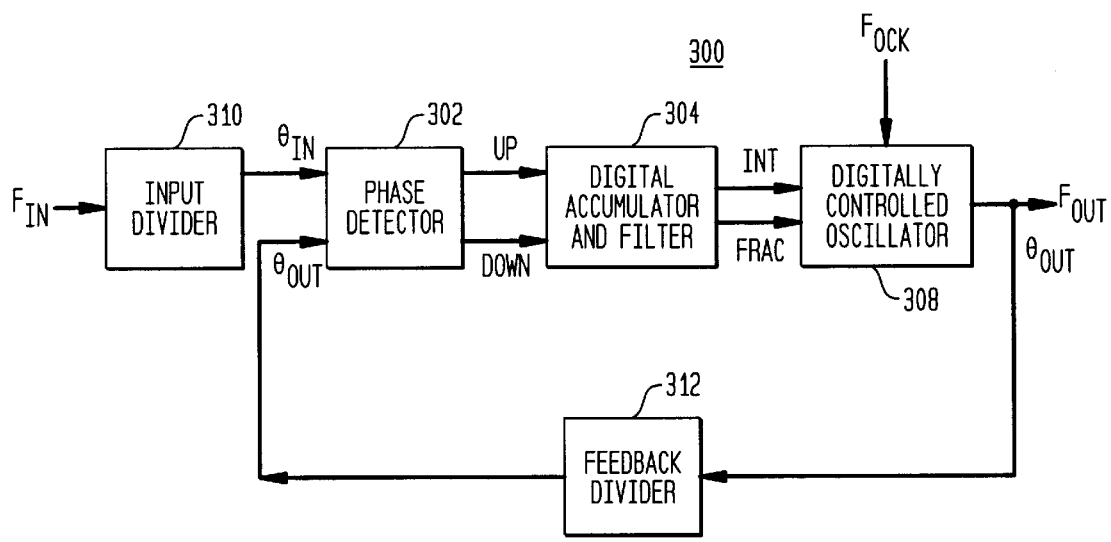
FIG. 3 shows a block diagram of a PLL, according to one embodiment of the present invention.

FIG. 3 shows a block diagram of phase-locked loop 300, according to one embodiment of the present invention. Phase detector 302 and optional input and feedback dividers 310 and 312 may be similar to the corresponding components in conventional digital PLL 200 of FIG. 2. Unlike digital accumulator and filter 208 of PLL 200, however, digital accumulator and filter 304 of PLL 300 uses the UP and DOWN signals from PD 302 to generate a digital control signal having two parts: an integer part (INT) and a fractional part (FRAC) corresponding to the integer portion N and the fractional portion xxx, respectively, of a positive value (N.xxx) represented by the digital control signal. In addition, unlike DCO 208 of PLL 200, digitally controlled oscillator 308 of PLL 300 uses the two-part digital control signal to generate a PLL output signal $F_{OUT}$ that can have a frequency greater than the frequency of the externally generated, oscillator clock $F_{OCK}$.

Figure 4:
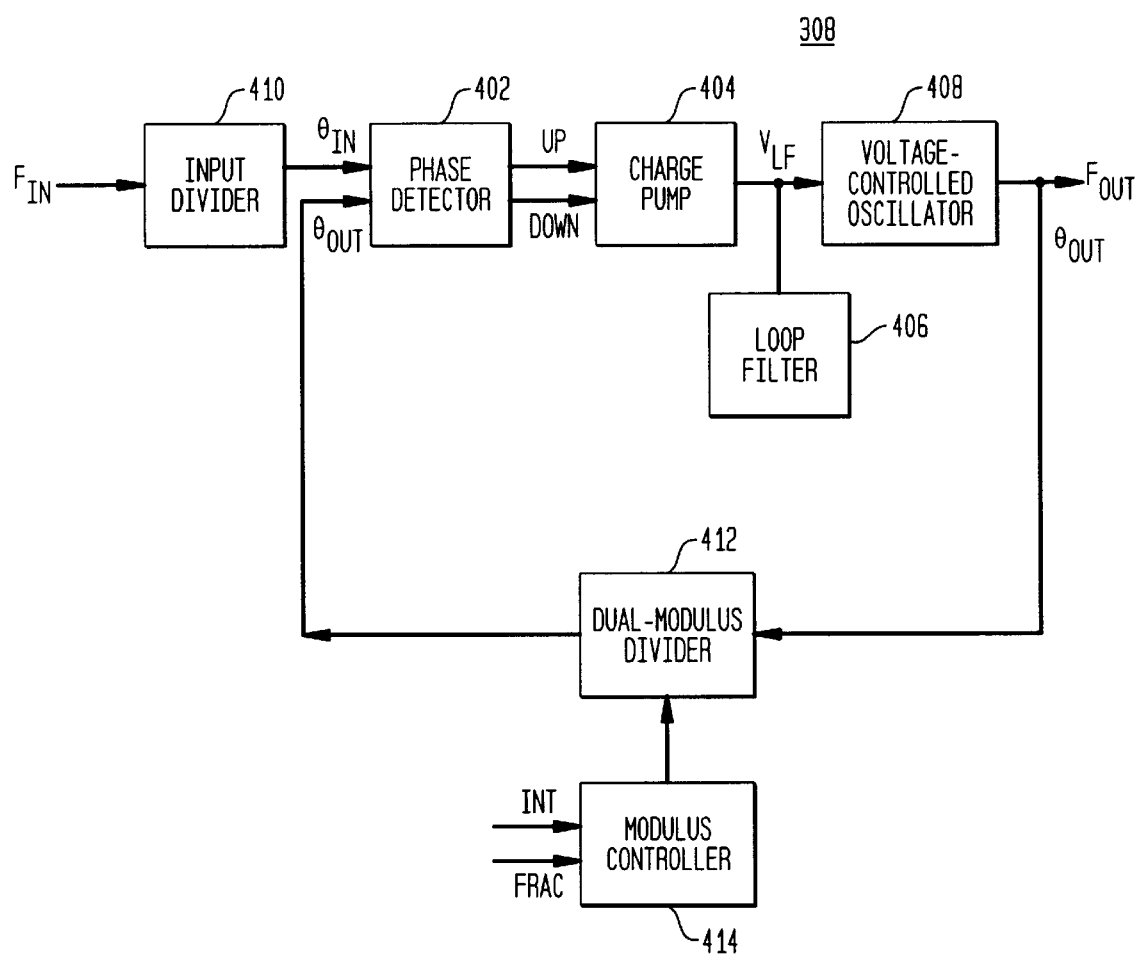
FIG. 4 shows a block diagram of the digitally controlled oscillator of the PLL of FIG. 3, according to one embodiment of the present invention.

FIG. 4 shows a block diagram of DCO 308 of PLL 300 of FIG. 3, according to one embodiment of the present invention. Basically, DCO 308 is an analog PLL having a dual-modulus divider 412 in its feedback path. In particular, phase detector 402, charge pump 404, loop filter 406, voltage-controlled oscillator 408, and optional input divider 410 may be similar to the corresponding components in conventional analog PLL 100 of FIG. 1. Unlike PLL 100, however, which has a simple divider 112 in its feedback path, the feedback path of DCO 308 has dual-modulus divider 412, which is controlled by modulus controller 414. In a preferred embodiment, DCO 308 is a fractional-N synthesizer that receives a digital control word having integer and fractional part, and multiplies an input clock signal by an (integer+fraction) value represented by the digital control word to generate an output clock signal having a higher output frequency.

In operation, DCO 308 receives, at modulus controller 414, the two-part digital control signal (INT, FRAC) generated by digital accumulator and filter 304 of FIG. 3, and, at optional input divider 410, the oscillator clock signal $F_{OCK}$. DCO 308 operates like a conventional analog PLL to convert the DCO input signal $F_{OCK}$ into the DCO output signal $F_{OUT}$, which is also the output signal of PLL 300 of FIG. 3, based on the divisor values set in optional input divider 410 and dual-modulus divider 412.

Modulus controller 414 controls which of two specified divisors is currently used by dual-modulus divider 414 in dividing the DCO feedback signal. In a preferred embodiment, the two specified divisor values are equal to INT (i.e., the integer part of the two-part control signal) and INT+1. Modulus controller 414 controls dual-modulus divider 414 to toggle back and forth between INT and INT+1 based on the value of the fractional part FRAC to achieve, over time, an effective divider value equal to N.xxx. For example, if INT is 27 and FRAC is an 8-bit binary value corresponding to 192, then modulus controller 414 will control dual-modulus divider 414 to apply the divisor value 27 one-quarter of the time and the divisor value 28 three-quarters of the time to achieve, over time, an effective divider value of 27.75, where 192/256=0.75.

Since dividing in the feedback path has the effect of multiplying up the frequency of the output signal relative to the input signal, DCO 308 can be used to generate an output signal $F_{OUT}$ having a frequency greater than the frequency of the DCO input signal $F_{OCK}$. Of course, by selecting appropriate divisor values for input divider 410 and dual-modulus divider 412, the DCO output signal $F_{OUT}$ could also have a frequency equal to or less than the frequency of the DCO input signal $F_{OCK}$.

Figure 1:
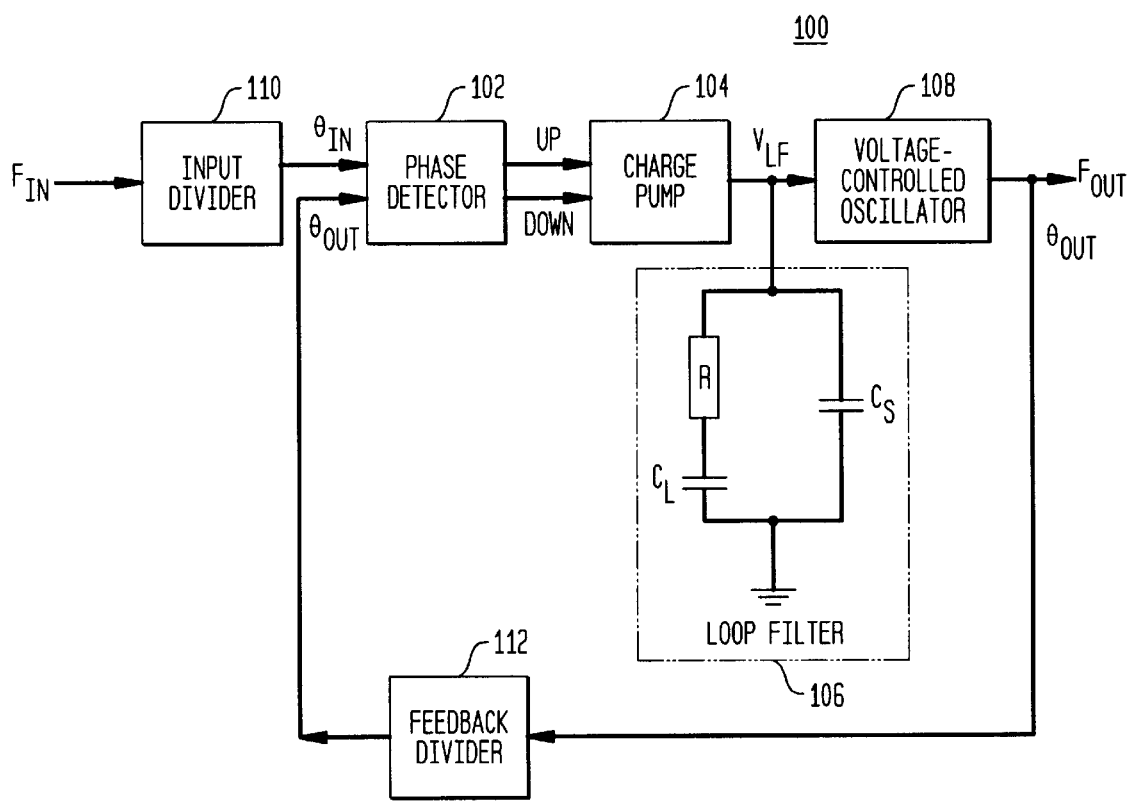
FIG. 1 shows a block diagram of a conventional charge-pump phase-locked loop (PLL)

With DCO 308 of FIG. 4 as the digitally controlled oscillator, PLL 300 can be implemented in applications that are impractical using prior-art PLLs, such as PLLs 100 and 200 of FIGS. 1 and 2. In particular, by implementing VCO 408 of FIG. 4 using a ring oscillator comprising a ring of delay cells, PLL 300 can be integrated in digital ASICs to implement applications such as high-multiplication frequency synthesizers and clock filtering. Because DCO 308 is implemented using an analog PLL that can multiply up the oscillator clock frequency, the outer loop of PLL 300 (shown in FIG. 3) can have an arbitrarily low loop bandwidth, limited only by the frequency drift between the input reference $F_{IN}$ and the oscillator clock $F_{OCK}$, and system considerations such as acquisition time.

Moreover, when the oscillator clock signal $F_{OCK}$ has a relatively high frequency, the inner loop of PLL 300 (shown in FIG. 4) can have an extremely wide loop bandwidth to substantially cancel noise sources internal to the charge-pump analog PLL that form DCO 308, thereby resulting in low noise at the PLL output signal $F_{OUT}$.

Thus, the present invention can be use in PLL applications requiring both low (outer) loop bandwidth and low output noise, without having to use expensive crystal-based voltage-controlled oscillators, which are currently used for such applications as SONET clock distribution. This results in a significant cost reduction over the current state of the art.

Although the present invention has been described in the context of PLLs implemented using phase detectors, such as PD 302 of FIG. 3 and PD 402 of FIG. 4, it will be understood that the present invention could also be implemented using phase/frequency detectors instead of either one or both of the phase detectors.

Although the present invention has been described in the context of digital PLL having a digitally controlled oscillator that is itself an analog PLL, the present invention can be implemented in other contexts as well. In general, the present invention is directed to any PLL having a DCO that converts an oscillator clock signal into an output signal having a higher frequency. As such, the rest of the PLL need not necessarily be digital components. For example, it may be possible to implement the PLL with a charge pump whose output signals are digitized for use in generating the DCO digital control signal. In addition, the DCO itself need not necessarily be implemented using an analog PLL. For example, the DCO could be implemented using a digital PLL that multiplies up the oscillator clock signal. Nor does the DCO digital control signal have to be a two-part signal.

It will be further understood that various changes in the details, materials, and arrangements of the parts which have been described and illustrated in order to explain the nature of this invention may be made by those skilled in the art without departing from the scope of the invention as expressed in the following claims.

What is claimed is:

1. An integrated circuit (IC) having a phase-locked loop (PLL), the PLL comprising:
    (a) a phase detector (PD), configured to receive a PLL input signal and a PLL feedback signal and to generate PLL PD signals based on differences in phase between the PLL input and PLL feedback signals;
    (b) an accumulator/filter, configured to receive the PLL PD signals from the phase detector and to generate a digital control signal; and
    (c) a digitally controlled oscillator (DCO) comprising:
        (A) a DCO PD, configured to receive an oscillator clock signal and a DCO feedback signal and to generate DCO PD signals based on differences in phase between the oscillator clock and DCO feedback signals;
        (B) a charge pump (CP), configured to receive the DCO PD signals from the DCO PD and to generate a CP charge current;
        (C) a loop filter, configured to receive the CP charge current and to generate a loop-filter voltage control signal;
        (D) a voltage-controlled oscillator (VCO), configured to receive the loop-filter voltage control signal and to generate a PLL output signal based on the loop-filter control signal;
        (E) a dual-modulus divider, configured to receive the output signal and to generate the DCO feedback signal by applying one of two selected divisor values; and
        (F) a modulus controller, configured to receive the digital control signal from the accumulator/filter and to control which of the two selected divisors is applied by the dual-modulus divider, wherein:
            the accumulator/filter generates the digital control signal as a two-part digital control signal comprising an integer part INT and a fractional part FRAC;
            the two selected divisor values are based on the integer part INT; and
            the modulus controller controls how often the two selected divisor values are applied by the dual-modulus divider based on the value of FRAC.

2. The IC of claim 1, wherein the two selected divisor values are INT and INT+1.

3. The IC of claim 1, wherein the PLL further comprises a PLL input divider configured to generate the PLL input signal based on a PLL input divisor value for input to the PD.

4. The IC of claim 1, wherein the VCO comprises a ring oscillator.

* * * * *